US005769943A

United States Patent [19]

Fleurial et al.

[11] Patent Number: 5,769,943
[45] Date of Patent: Jun. 23, 1998

[54] SEMICONDUCTOR APPARATUS UTILIZING GRADIENT FREEZE AND LIQUID-SOLID TECHNIQUES

[75] Inventors: Jean-Pierre Fleurial; Thierry F. Caillat, both of Pasadena; Alexander Borshchevsky, Santa Monica, all of Calif.

[73] Assignee: California Institute of Technology, Pasadena, Calif.

[21] Appl. No.: 101,901

[22] Filed: Aug. 3, 1993

[51] Int. Cl.⁶ ............................................. C30B 35/00
[52] U.S. Cl. ............................ 117/219; 117/83; 117/224; 117/914
[58] Field of Search ................. 117/83, 200, 204, 117/206, 219, 224, 914

[56] References Cited

U.S. PATENT DOCUMENTS

| | | | |
|---|---|---|---|
| 2,588,254 | 3/1952 | Lark-Horovitz et al. | 136/89 |
| 2,798,989 | 7/1957 | Welker | 317/237 |
| 3,033,659 | 5/1962 | Fischer | 117/83 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,356,464 | 12/1967 | Hulliger | 23/315 |
| 3,414,387 | 12/1968 | Syoev et al. | 117/83 |
| 3,626,583 | 12/1971 | Abbott et al. | 29/573 |
| 3,674,568 | 7/1972 | Caprarola | 136/205 |
| 3,696,038 | 10/1972 | Davies et al. | 117/83 |
| 3,721,583 | 3/1973 | Blakeslee | 117/215 |
| 3,873,370 | 3/1975 | Hampl, Jr. et al. | 136/205 |
| 4,029,520 | 6/1977 | Hampl, Jr. | 136/205 |
| 4,050,905 | 9/1977 | Swinehart | 117/83 |
| 4,088,515 | 5/1978 | Blakeslee et al. | 148/175 |
| 4,261,771 | 4/1981 | Dingle et al. | 148/175 |
| 4,368,416 | 1/1983 | James | 322/2 R |
| 4,457,897 | 7/1984 | Stanley et al. | 423/141 |
| 4,469,977 | 9/1984 | Quinn et al. | 310/334 |
| 4,551,196 | 11/1985 | Capper et al. | 117/83 |
| 4,620,897 | 11/1986 | Nakajima | 156/602 |
| 4,644,753 | 2/1987 | Burke | 62/3 |
| 4,664,960 | 5/1987 | Ovshinsky | 428/98 |

(List continued on next page.)

FOREIGN PATENT DOCUMENTS

| 1216001 | 1/1968 | United Kingdom | H01V 1/14 |
|---|---|---|---|

OTHER PUBLICATIONS

Vining, C.B. & J.–P. Fleurial, "Silicon–Germanium: an Overview of Recent Developments," Proceedings of the Xth Intl. Conference on thermoelectrics, Univ. of Wales, Cardiff, UK, pp. 1–14, Sep. 10–12, 1991.

(List continued on next page.)

*Primary Examiner*—Felisa Garrett
*Attorney, Agent, or Firm*—Baker & Botts, L.L.P.

[57] ABSTRACT

Transition metals of Group VIII (Co, Rh and Ir) have been prepared as semiconductor compounds with the general formula $TSb_3$. The skutterudite-type crystal lattice structure of these semiconductor compounds and their enhanced thermoelectric properties results in semiconductor materials which may be used in the fabrication of thermoelectric elements to substantially improve the efficiency of the resulting thermoelectric device. Semiconductor materials having the desired skutterudite-type crystal lattice structure may be prepared in accordance with the present invention by using vertical gradient freezing techniques and/or liquid phase sintering techniques. Measurements of electrical and thermal transport properties of selected semiconductor materials prepared in accordance with the present invention, demonstrated high Hall mobilities (up to 1200 $cm^2.V^{-1}.s^{-1}$) and good Seebeck coefficients (up to 150 $\mu VK^{-1}$ between 300° C. and 700° C.). Optimizing the transport properties of semiconductor materials prepared from elemental mixtures Co, Rh, Ir and Sb resulted in a substantial increase in the thermoelectric figure of merit (ZT) at temperatures as high as 400° C. for thermoelectric elements fabricated from such semiconductor materials.

12 Claims, 4 Drawing Sheets

U.S. PATENT DOCUMENTS

| | | | |
|---|---|---|---|
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 4,999,082 | 3/1991 | Kremer et al. | 156/605 |
| 5,006,178 | 4/1991 | Bijvoets | 136/211 |
| 5,021,224 | 6/1991 | Nakajima | 422/248 |
| 5,051,786 | 9/1991 | Nicollian et al. | 357/4 |
| 5,064,476 | 11/1991 | Recine, Sr. | 136/201 |
| 5,156,004 | 10/1992 | Wu et al. | 62/3 |
| 5,181,086 | 1/1993 | Yoshida | 257/18 |
| 5,210,428 | 5/1993 | Goossen | 257/17 |
| 5,288,336 | 2/1994 | Strachan et al. | 136/200 |
| 5,415,699 | 5/1995 | Harman | 136/238 |
| 5,436,467 | 7/1995 | Elsner et al. | 257/25 |
| 5,439,528 | 8/1995 | Miller | 136/200 |

OTHER PUBLICATIONS

Caillat, T., et al., "Search for New High Temperature Thermoelectric Materials," Proceedings of the 27th Intersociety Energy Conversion Engineering Conference, pp. 3499–3503, Aug. 3–7, 1992.

Caillat, T., et al., "Thermoelectric Properties of a New Semiconductor $IrSb_3$," Proceedings of the XIth Intl. Conference on Thermoelectrics, Univ. of Texas, Arlington, TX pp. 98–101, Oct. 7–9, 1992.

Caillat, T., et al., "Phase Diagram of the Ir–Sb System on the Antimony–Rich Part," Journal of Alloys and Compounds, 1993.

Kjekshus, A., "Thigh Temperature X–Ray Study of the Thermal Expansion of $IrAs_3$ and $IrSb_3$," Acta Chemica Scandinava, pp. 678–681, 1961.

Fleurial, J.–P., "Thermal and Electrical Transport Properties Modeling of $Bi_2Te_3$–Based Alloys," Proceedings of the XIth Intl. Conf. on Thermoelectrics, Univ. of Texas, Arlington, TX pp. 276–281, Oct. 7–9, 1992.

Bass, J.C. and N. Elsner, "Current Thermoelectric Programs at Hi–Z Technology, Inc.," Proceedings of the XIth Intl. Conference on Thermoelectrics, Univ. of Texas, Arlington, TX, pp. 1–3, Oct. 7–9, 1992.

Borschevsky, A., et al., "Two–Zone Bridgman Furnace with Sharp Thermal Gradient," NASA Tech Brief, 18 (3) Item #74, Mar. 1994.

Dudkin, L.D., et al., "On the Doping of the Semiconductor Compound $CoSb_3$," Zhur. Neorg. Khim., 1958.

Feschotte P., and D. Lorin, "Les Systemes Binaires Fe–Sb, Co–Sb et Ni–Sb," J. Less Common Metals, pp. 155, 255–269, 1989.

Kajikawa, T., et al., "Advancement of Thermoelectric Energy Conversion Systems in Japan," Proceedings of the XIth Intl. Conference on Thermoelectrics, Univ. of Texas, Arlington, TX, pp. 175–180, Oct. 7–9, 1992.

Kliche, G. W. Bauhofer, "Infrared Reflection Spectra and Electrical Properties of the Skutterudite RhSb3," Mat. Res. Bull., (22), pp. 551–555, 1987.

Korenstein, R. et al., "Preparation and Characterization of the Skutterudite–Related Phases CoGe1.5 and CoGe1.5Se1.5," Inorg. Chemist., 16(9), pp. 2344–2346, 1977.

Lutz, H.D., et al. "Far–Infrared Spectra, Optical and Dielectric Constants, Effective Charges and Lattice Dynamics of the Skutterudites CoP3CoAs3 and CoSb3," Phys. Stat. Sol. (b), pp. 112, 549–557, 1982.

Lyons, A., et al., "The Preparation and Characterization of Some Skutterudite Related Compounds," Mat. Res. Bull., (13), pp. 125–128, 1978.

Nikolaev, Yu V., et al., "A Terrestrial Solar Power Plant with Direct Energy Conversion," Proceedings of the 27th Intersociety Energy Conversion Conference, pp. 3433–3436, Aug. 3–7, 1992.

Vining, C.B., "The Thermoelectric Limit ZT=1: Fact or Artifact . . . ," Proceedings of the XIth Intl. Conference on Thermoelectrics, Univ. of Texas, Arlington, TX, pp. 223–231, Oct. 7–9, 1992.

Zhuravlev, N.N., et al., Vestn. Mosk. Univ., Ser. Mat., Mekh., Astron., Fiz. I Khim., 13 (5) pp. 79–82, 1958.

SEMICONDUCTOR APPARATUS UTILIZING GRADIENT FREEZE AND LIQUID-SOLID TECHNIQUES

The invention described herein was made in the performance of work under a NASA contract, and is subject to the provisions of Public Law 96-517 (35 U.S.C. 202) in which the Contractor has elected to retain title.

TECHNICAL FIELD OF THE INVENTION

This invention relates to the design and preparation of semiconductor materials having enhanced thermoelectric properties.

BACKGROUND OF THE INVENTION

The basic theory and operation of thermoelectric devices has been developed for many years. Modern thermoelectric cooling devices typically include an array of thermocouples which operate by using the Peltier effect. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of the materials used in fabrication of the thermoelectric device.

The thermoelectric figure of merit (ZT) is a dimensionless measure of the effectiveness of a thermoelectric device and is related to material properties by the following equation:

$$ZT = S^2 \sigma T / \kappa \quad (1)$$

where S, $\sigma$, $\kappa$, and T are the Seebeck coefficient, electrical conductivity, thermal conductivity and absolute temperature, respectively. The Seebeck coefficient (S) is a measure of how readily the respective carriers (electrons or holes) can change energy in a temperature gradient as they move across a thermoelectric element. The thermoelectric figure of merit is related to the strength of interaction of charge carriers with the lattice structure and the available energy states associated with the respective materials.

The ZT may also be stated by the equation:

$$ZT = \frac{S^2 T}{\rho \kappa} \quad (2)$$

$\rho$ = electrical resistivity
$\sigma$ = electrical conductivity $$\text{electrical conductivity} = \frac{1}{\text{electrical resistivity}} \text{ or } \sigma = \frac{1}{\rho}$$

Thermoelectric materials such as alloys of $Bi_2Te_3$, PbTe and BiSb were developed thirty to forty years ago. More recently, semiconductor alloys such as SiGe have been used in the fabrication of thermoelectric devices. Commercially available thermoelectric materials are generally limited to use in a temperature range between 300° K. and 1300° K. with a maximum ZT value of approximately one. The efficiency of such thermoelectric devices remains relatively low at approximately five to eight percent (5–8%) energy conversion efficiency. For the temperature range of –100° C. to 1000° C., maximum ZT of current state of the art thermoelectric materials remains limited to values of approximately 1, except for Te-Ag-Ge-Sb alloys (TAGS) which may achieve a ZT of 1.2 to 1.4 in a very narrow temperature range. Recently developed materials such as $Si_{80}Ge_{20}$ alloys used in thermoelectric generators to power spacecrafts for deep space missions have a thermoelectric figure of merit approximately equal to 0.5 from 300° C. to 1,000° C.

SUMMARY OF THE INVENTION

In accordance with the present invention disadvantages and problems associated with the previous design and preparation of materials used in the manufacture of thermoelectric devices have been substantially reduced or eliminated. The present invention provides the ability to obtain increased efficiency from a thermoelectric device by using materials with a skutterudite-type crystal lattice structure and desired thermoelectric characteristics in fabrication of the thermoelectric device. Examples of semiconductor materials and compounds which are satisfactory for use with the present invention include, but are not limited to, $IrSb_3$, $RhSb_3$ and $CoSb_3$ and alloys of these compounds.

In accordance with one aspect of the present invention, P-type semiconductor materials are formed from alloys of $CoSb_3$, $RhSb_3$ or $IrSb_3$ for use in manufacturing thermoelectric devices with substantially enhanced operating characteristics and improved efficiency as compared to previous thermoelectric devices.

In accordance with another aspect of the present invention, N-type semiconductor materials are formed from alloys of $CoSb_3$, $RhSb_3$ or $IrSb_3$ for use in manufacturing thermoelectric devices with substantially enhanced operating characteristics and improved efficiency as compared to previous thermoelectric devices.

An important technical advantage of the present invention includes the use of gradient freezing techniques in the preparation of semiconductor materials such as $IrSb_3$, $RhSb_3$ and $CoSb_3$. The use of gradient freezing techniques in accordance with the present invention produces a large, single crystal of semiconductor material having a skutterudite lattice structure. A Bridgeman Two-Zone furnace and a sealed container have been modified for use in preparation of semiconductor materials in accordance with the present invention.

Another important technical advantage of the present invention includes the use of liquid phase sintering techniques in the preparation of semiconductor materials such as $IrSb_3$, $RhSb_3$ and $CoSb_3$. The use of liquid phase sintering techniques in accordance with the present invention produces a large, single crystal of semiconductor material having a skutterudite lattice structure. An isothermal furnace and a sealed container have been modified for use in preparation of semiconductor materials in accordance with the present invention.

Another aspect of the present invention includes manufacturing a thermoelectric device with P-type thermoelectric elements formed from materials such as $CoSb_3$, $RhSb_3$ or $IrSb_3$ and N-type thermoelectric elements formed from $Si_{80}Ge_{20}$ or alloys of bismuth (Bi), arsenic (As), antimony (Sb), selenium (Se), and tellurium (Te), the salts of lead with chalconide materials, sulphur (S), tellurium and selenium.

The present invention allows the manufacture of thermoelectric energy conversion devices such as electrical power generators, coolers, and thermocouples or temperature detectors with high ZT and associated increased efficiency.

By the use of semiconductor compounds such as $IrSb_3$, $RhSb_3$ and $CoSb_3$ and alloys of these compounds which have been prepared in accordance with the present invention, the overall efficiency of a thermoelectric device may be substantially enhanced. The thermoelectric elements or thermocouples fabricated from semiconductor materials such as $IrSb_3$, $RhSb_3$ and $CoSb_3$ with skutterudite-type crystal lattice structures have demonstrated a ZT of 2 over a wide temperature range.

A further important technical advantage includes the use of semiconductor materials prepared in accordance with the present invention in the manufacture of a radioisotope thermoelectric generator (RTG) to substantially enhance the associated system efficiency and to significantly increase the operating temperature range of the resulting RTG. Such thermoelectric devices may be used in space power systems. Other thermoelectric devices manufactured from semiconductor materials fabricated in accordance with the present invention may be used in waste heat recovery systems, automobiles, remote power generators and sensors and coolers for advanced electronic components such as field effect transistors.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

The preferred embodiments of the present invention and its advantages are best understood by reference to FIGS. 1 through 12 of the drawings, like numerals being used for like corresponding parts of the various drawings.

Figure 1:
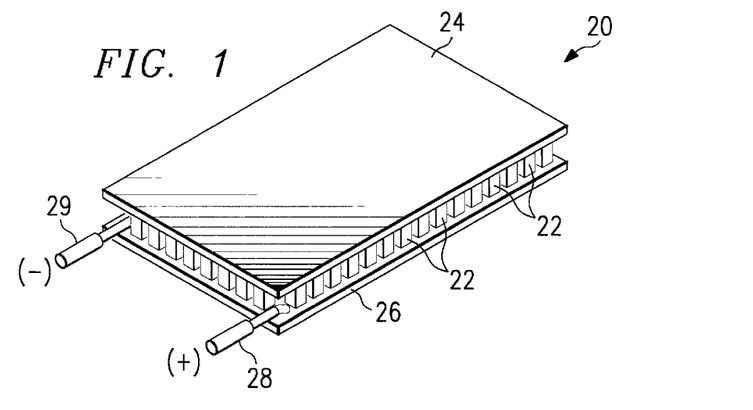
FIG. 1 is an isometric drawing of a thermoelectric device which may be manufactured from materials incorporating the present invention.
Figure 2:
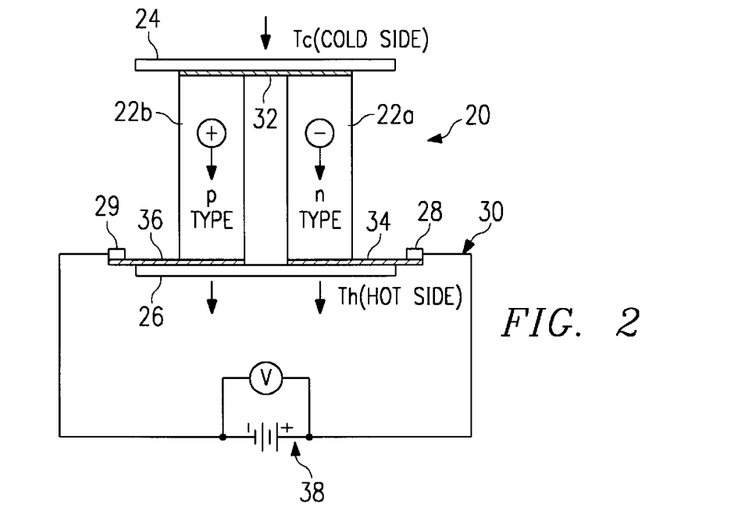
FIG. 2 is an electrical schematic drawing of the thermoelectric device of FIG. 1.

Thermoelectric device 20, as shown in FIGS. 1 and 2, may be manufactured from semiconductor materials and compounds which have been prepared in accordance with the present invention. The use of such semiconductor materials will substantially increase energy conversion efficiency. Thermoelectric device 20, as shown, may be used as a heater and/or a cooler. Thermoelectric device 20 is preferably manufactured with a plurality of thermoelectric elements (sometimes referred to as "thermocouples") 22 disposed between cold plate 24 and hot plate 26. Electrical power connections 28 and 29 are provided to allow attaching thermoelectric device 20 to an appropriate source of DC electrical power. If thermoelectric device 20 were redesigned to function as an electrical power generator, electrical connections 28 and 29 would represent the output terminals from such a power generator operating between hot and cold temperature sources (not shown).

FIG. 2 is a schematic representation of electrical circuit 30 associated with thermoelectric device 20. Electrical circuit 30 is also typical of electrical circuits associated with using thermoelectric elements or thermocouples to convert heat energy into electrical energy. Such electrical power generators may be used in waste heat recovery systems (not shown), space power systems (not shown) and radioisotope power generators (not shown).

Electrical circuit 30, which is typical for a single stage thermoelectric device such as thermoelectric device 20, generally includes two dissimilar materials such as N-type thermoelectric elements 22a and P-type thermoelectric elements 22b. Thermoelectric elements 22 are typically arranged in an alternating N-type element to P-type element configuration. In many thermoelectric devices, semiconductor materials with dissimilar characteristics are connected electrically in series and thermally in parallel.

N-type semiconductor materials have more electrons than necessary to complete a perfect molecular lattice structure. P-type semiconductor materials have fewer electrons than necessary to complete a lattice structure. The "missing electrons" are sometimes referred to as "holes." The extra electrons in the N-type semiconductor material and the holes in the P-type semiconductor material (hereinafter referred to as "carriers") are the agents which transport or move heat energy between cold side or cold plate 24 and hot side or hot plate 26 of thermoelectric elements 22. Ceramic materials are frequently used in the manufacture of plates 24 and 26 which define in part the cold side and hot side, respectively, of thermoelectric device 22.

In thermoelectric device 20, alternating thermoelectric elements 22 of N-type and P-type semiconductor materials have their ends connected in a serpentine fashion by electrical conductors such as 32, 34 and 36. Conductors 32, 34 and 36 are typically metalizations formed on the interior surfaces of plates 24 and 26. Commercially available thermoelectric coolers may include two metalized ceramic plates with P-type and N-type elements of bismuth telluride alloys soldered between the ceramic plates.

When DC electrical power from power supply 38 is applied to thermoelectric device 20 having an array of thermoelectric elements 22, heat energy is absorbed on cold side 24 of thermoelectric elements 22. The heat energy passes through thermoelectric elements 22 and is dissipated on hot side 26. A heat sink (sometimes referred to as the "hot sink", not shown) may be attached to hot plate 26 of thermoelectric device 20 to aid in dissipating heat from thermoelectric elements 22 to the adjacent environment. In a similar manner a heat sink (sometimes referred to as a "cold sink", not shown) may be attached to cold side 24 of thermoelectric device 20 to aid in removing heat from the adjacent environment. Thermoelectric device 20 may sometimes be referred to as a thermoelectric cooler. However, since thermoelectric devices are a type of heat pump, thermoelectric device 20 may function as either a cooler, heater, or power generator.

Figure 3:
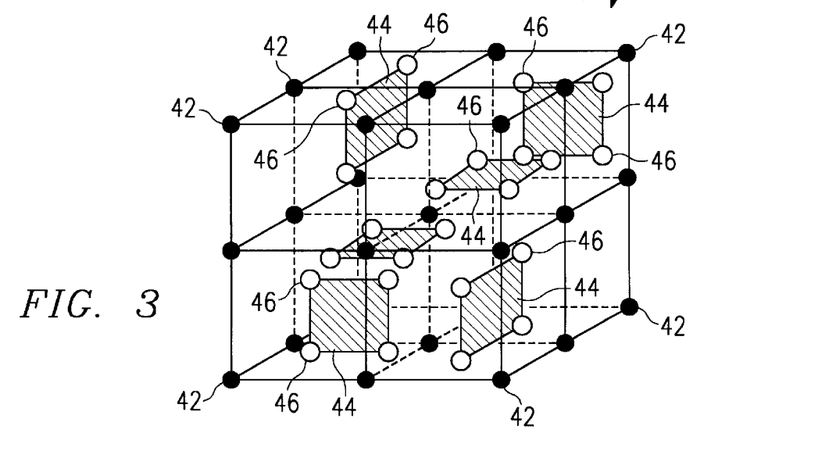
FIG. 3 is an isometric representation of a skutterudite-type crystal lattice structure associated with semiconductor materials which have been fabricated in accordance with the present invention.

Semiconductor materials (sometimes referred to as "semiconductor compounds") $CoSb_3$, $RhSb_3$ and $IrSb_3$ have been prepared in accordance with the present invention in the form of a large, single crystal with a skutterudite lattice structure 40 as shown in FIG. 3. As will be explained later in more detail, such semiconductor materials are preferably prepared in an antimony rich environment. The skutterudite crystal lattice structure is defined in part by a unit cell with eight members having the formula $AB_3$. A may be selected from the group consisting of Co, Rh and Ir. B may be Sb. The unit cell dimension is approximately 9.249 Angstroms. Alloys of these compounds having the formula $Co_{1-x-y}Rh_xIr_ySb_3$, where $0 \leq x \leq 1$ and $0 \leq y \leq 1$, have also been prepared using the present invention.

Skutterudite-type crystal lattice structure 40 includes a cubic lattice of metal atoms 42. Metal atoms 42 are preferably selected from the group consisting of cobalt, iridium, and/or rhodium. A four-member planary ring 44 of non-metal atoms 46 is disposed within the cubic lattice structure. Planary rings 44 preferably include four atoms of antimony. Each metal atom 42 has six neighbor atoms 42. Non-metal atoms 46 have two adjacent non-metal atoms 46 and two metal atoms 42. The covalant bonding associated with skutterudite-type crystal lattice structure 40 provides high electron mobility and low thermal conductivity.

Semiconductor materials having skutterudite-type crystal lattice structure 40 may be doped with selected impurities to produce N-type thermoelectric elements 22a and P-type thermoelectric elements 22b. For example, adding platinum (Pt) as a doping agent with $IrSb_3$ semiconductor material produced N-type thermoelectric elements having a ZT of approximately two at a temperature of 400° C. If desired, thermoelectric device 20 may be manufactured with P-type thermoelectric elements 22b fabricated from $IrSb_3$ and N-type thermoelectric elements 22a fabricated from previously available semiconductor materials such as alloys of Bi, As, Sb, Te, salts of lead with chalconide materials, sulphur, tellurium and selenium.

Figure 4:
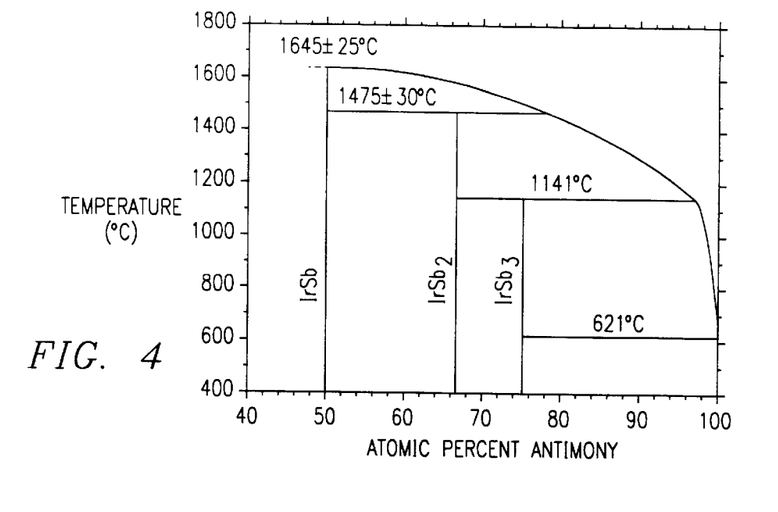
FIG. 4 is an iridium antimony phase diagram.

Large, single crystals of semiconductor materials have been prepared in accordance with the present invention using both gradient freezing techniques and liquid phase sintering techniques. The phase diagram for iridium-antimony, as shown in FIG. 4, demonstrates that growth of the desired skutterudite-type crystal lattice structure is very difficult. Such crystal growth is preferably initiated from a narrow range of compositions. In addition, the liquid crystal curve in the region forming $IrSb_3$ is relatively sharp which further increases the difficulty of separating liquid and solid phases during crystallization.

Depending upon the type of semiconductor material and the relationship of cobalt, rhodium and iridium, either gradient freeze techniques or liquid phase sintering techniques may be used to produce the desired skutterudite-type crystal lattice structure. For some semiconductor materials such as $CoSb_3$ and $RhSb_3$, gradient freeze techniques have produced the desired large, single crystal. For other semiconductor materials such as single phase $IrSb_3$, liquid phase sintering techniques have produced the desired large, single crystals. Both methods of crystal growth, gradient freeze and liquid phase sintering, are preferably initiated from non-stoichiometric (antimony rich) melts based on the liquid phase diagram associated with the elements which will comprise the resulting semiconductor materials.

Figure 5A:
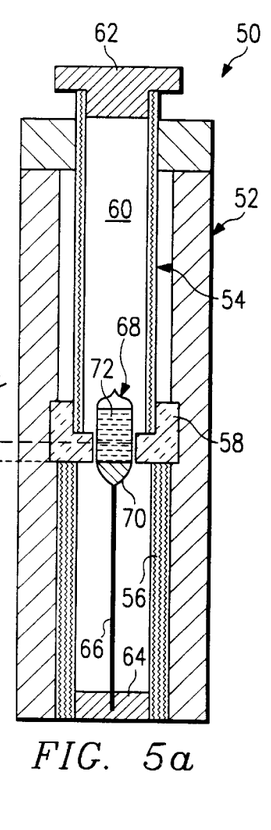
FIG. 5a is a schematic drawing in elevation and in section with portions broken away showing a Bridgeman Two-Zone furnace which may be used to prepare semiconductor materials using gradient freezing techniques in accordance with the present invention.

Large, single crystals of semiconductor materials with the desired skutterudite lattice structure 40 may be grown by using gradient freeze techniques and furnace 50 as shown in FIG. 5a. Furnace 50 is frequently referred to as a Bridgeman Two-Zone furnace. Furnace 50 includes housing 52 with a first or upper heater assembly 54 and a second or lower heater assembly 56. Housing 52 defines in part chamber 60. Thermal baffle 58 is preferably disposed between first heater assembly 54 and second heater assembly 56 intermediate chamber 60. Various components which comprise furnace 50 are preferably disposed vertically within chamber 60 of housing 52.

As shown in FIG. 5a, housing 52 includes end closure 62 which seals the upper portion of chamber 60 and end closure 64 which seals the lower portion of chamber 60. Quartz rod 66 may be vertically disposed within chamber 60. Container 68 is preferably secured to one end of rod 66 adjacent to thermal baffle 58.

The lower portion 70 of container 68 is preferably pointed or tapered with respect to rod 66. Various types of containers 68 may be satisfactorily used with the present invention. A sealed quartz crystal or quartz ampoule has been found satisfactory for use with furnace 50. If desired, housing 52 and end closure 64 may be modified to allow a conveyor (not shown) with a plurality of rods 66 and containers 68 to be passed sequentially through furnace 50.

Figure 5B:
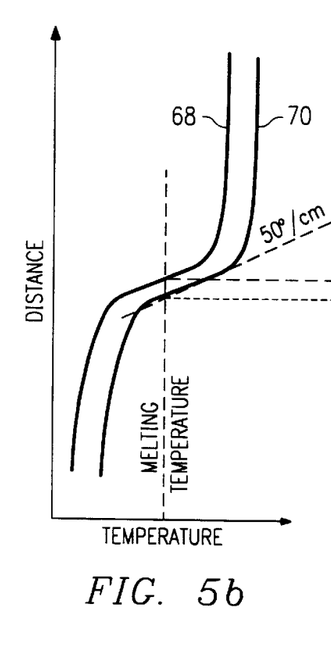
FIG. 5b is a graph showing the temperature gradient associated with growing large, single crystals of semiconductor materials having a skutterudite lattice structure in accordance with the present invention.

Elements such as Co, Rh and Sb powders which will be formed into the desired semiconductor material using furnace 50 are preferably sealed within container 68 under a vacuum. Pointed or tapered end 70 of container 68 is attached to quartz rod 66 and disposed vertically within chamber 60. Tapered end 70 and its attachment to rod 66 cooperate to maintain the desired temperature gradients in container 68. Furnace 50 is then heated to establish the temperature gradients 68 and 67 as shown in FIG. 5b. Various temperature gradients may be used depending upon the elements placed within container 68 to produce the desired semiconductor material.

Samples of $CoSb_3$ and $RhSb_3$ were directionally crystallized from non-stoichiometric melts 72 rich in antimony. Crystals of $CoSb_3$ and $RhSb_3$ were grown with an axial temperature gradient of about 50° C./cm and a growth rate about 1 mm/day. The crystals of $CoSb_3$ and $RhSb_3$ were approximately 10 mm long and 6 mm in diameter. The average density of the $CoSb_3$ crystals was measured and found to be 99.7% of the theoretical density (7.69 g/cm$^3$).

The average density of the RhSb$_3$ crystals was measured and found to be 99.5% of the theoretical density (7.69 g/cm$^3$). Crystals of the Ir$_x$Co$_{1-x}$Sb$_3$ solid solutions were also successfully grown by the gradient freeze technique from antimony-rich melts in furnace 50.

Figure 6:
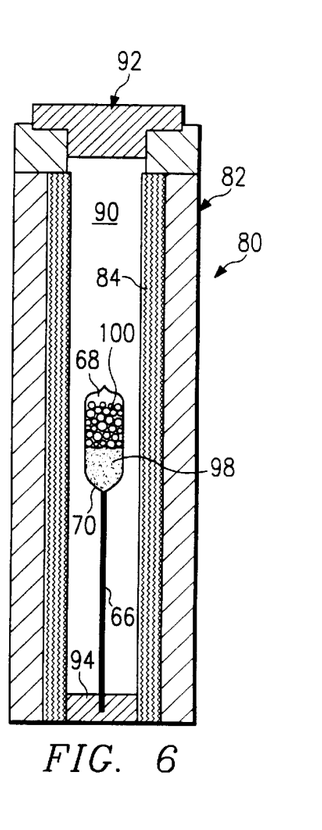
FIG. 6 is a schematic drawing in elevation and in section with portions broken away showing an isothermal furnace which may be used in growing large, single crystals of semiconductor materials having a skutterudite lattice structure in accordance with the present invention.

Large, single crystals of semiconductor materials with a skutterudite lattice structure may also be grown by using liquid phase sintering techniques and furnace 80 as shown in FIG. 6. Furnace 80 may be referred to as an isothermal furnace as compared to furnace 50 which has two different temperature zones. Furnace 80 includes housing 82 with heater assembly 84 disposed therein. Housing 82 defines in part chamber 90. Various components which comprise furnace 80 are preferably vertically disposed within chamber 90 of housing 82.

As shown in FIG. 6, housing 82 includes end closure 92 which seals the upper portion of chamber 90 and end closure 94 which seals the lower portion of chamber 90. Quartz rod 66 is preferably disposed vertically within chamber 90. Container 68 is preferably secured within chamber 90 intermediate end closures 94 and 92 at approximately the mid point of chamber 90.

The elements such as Ir, Rh, Co and Sb which will be used to form the desired semiconductor material may be sealed within container 68. The lower portion 70 of container 68 is preferably pointed or tapered with respect to quartz rod 66. The relationship of tapered end 70 with quartz rod 66 cooperate to maintain the desired temperature gradient in container 68 during growth of the skutterudite-type crystal structure 40. Various types of containers 68 may be satisfactorily used with the present invention. A sealed quartz crystal or crystal ampoule has been found satisfactory for use with the present invention. As previously noted for furnace 50, housing 82 and end closure 94 may be modified to allow a conveyor (not shown) to pass a plurality of rods 66 and containers 68 sequentially through furnace 80.

Liquid phase sintering techniques have been used to prepare large, single crystals of semiconductor material IrSb$_3$ and also some alloys of (Ir$_{1-x-y}$Rh$_x$Co$_y$)Sb$_3$ solid solutions using furnace 80 and container 68. The samples produced had good semiconducting properties including exceptional P-type Hall mobilities as high as 7725 cm$^2$.V$^-$$^1$.s$^{-1}$ at room temperature. The crystals were approximately 10 mm long and 6 mm in diameter.

The liquid phase sintering technique used to produce IrSb$_3$ and (Ir$_{1-x-y}$Rh$_x$Co$_y$)Sb$_3$ solid solutions included placing a first layer 98 of elemental iridium, cobalt and/or rhodium powders together with a second layer 100 of antimony shots in a container sealed under vacuum. In the case of the preparation of a solid solution (Ir$_{1-x-y}$Rh$_x$Co$_y$)Sb$_3$, the powders of iridium, cobalt and rhodium in the desired amount were loaded in plastic vials, mixed and shaken in a mixer mill for about thirty minutes. The container 68 with material layers 98 and 100 was then held vertical and heated in furnace 80 as illustrated in FIG. 6. Several different reaction times and temperatures were tried. For some mixtures, the best results were obtained with a reaction time of 24 hours at a temperature of 1000° C. Under these conditions, the resulting crystals were the most dense.

Transport properties measurements performed on samples of CoSb$_3$, RhSb$_3$ and (Ir$_{1-x-y}$Rh$_x$Co$_y$)Sb$_3$ prepared using the previously described procedures and apparatus demonstrated excellent semiconducting and thermoelectric properties. For example, the compounds with skutterudite crystallographic structure 40 had exceptional high P-type Hall mobilities. Room temperature values as high as 7725 cm$^2$.V$^{-1}$.s$^{-1}$ were measured on a RhSb$_3$ sample at a doping level of 2.4 10$^{18}$cm$^{-3}$. Although linked to the particular crystal structure of this compound, this high value is also a result of the good quality of the sample. For example, lower mobilities were measured on hot-pressed RhSb$_3$ samples such as a maximum value of 1500cm$^2$.V$^{-1}$.s$^{-1}$. Mobility as high as 17321 cm$^2$.V$^1$.s$^1$ were measured on P-type CoSb$_3$ single crystals compared to a maximum value of 290 cm$^2$.V$^-$$^1$.s$^{-1}$ for samples prepared by other procedures. IrSb$_3$ samples also possessed high P-type Hall mobilities as high as 1241 cm$^2$.V$^{-1}$.s$^{-1}$ at a doping level of 7.2 10 $^{18}$cm$^{-3}$.

Semiconductor compounds and related solid solutions have also been prepared by sintering elemental powders of iridium, cobalt, rhodium and antimony in various ratios. Completion of the reaction was achieved in times as short as six hours at a temperature of 600° C. These powders have been successfully hot-pressed under specific conditions into large ingots (not shown).

Powders of IrSb$_3$ compound and several compositions of the (Ir$_{1-x-y}$Rh$_x$Co$_y$)Sb$_3$ solid solutions were also prepared in relatively short times (as low as six hours) by hot press sintering elemental powders or iridium, cobalt, antimony and rhodium. Several different mixtures of elemental powders were successfully hot-pressed in a graphite die (not shown) into dense ingots about 15 mm long and 6 mm in diameter. The resulting compounds demonstrated exceptional thermoelectric properties.

Doping of the elemental powders can be achieved by introducing the desired amount of dopant in the initial powder load. By using commercially available hot presses and graphite die containers, this process is quick, cost effective and may be easily adapted to industrial manufacturing of large quantities of (Ir$_{1-x-y}$Rh$_x$Co$_y$)Sb$_3$ samples of different compositions and doping level.

Semiconductor compounds of CoSb$_3$, RhSb$_3$ and IrSb$_3$ with skutterudite-type crystal lattice structure prepared in accordance with the present invention have demonstrated the characteristics shown in the following Table 1.

TABLE I

| Material | CoSb$_3$ | RhSb$_3$ | IrSb$_3$ |
|---|---|---|---|
| Melting Point (C.) | 850 | 900 | 1140 |
| Type of formation from the melt | peritectic | peritectic | peritectic |
| Structure type | cubic | cubic | cubic |
| Prototype | CoAs$_3$ | CoAs$_3$ | CoAs$_3$ |
| Number of atoms/unit cell | 32 | 32 | 32 |
| Lattice parameter (Å) | 9.0347 | 9.2322 | 9.2533 |
| Density (g · cm$^{-3}$) | 7.69 | 7.96 | 9.32 |
| Thermal expansion coefficient (C$^{-1}$) | | | 2 × 10$^{-5}$ |
| Energy bandgap (eV) | 0.5 | | 1.17 |
| Conductivity type | p | p | p |
| Electrical resistivity (mΩ · cm) at 25 C. | 0.55 | 0.34 | 0.70 |
| Hall mobility (cm2 · V$^{-1}$ · s$^{-1}$) at 25 C. | 1732 | 7725 | 1241 |
| Hall carrier concentration (cm$^{-3}$) at 25 C. | 6.5 × 10$^{18}$ | 2.4 × 10$^{18}$ | 7.2 × 10$^{18}$ |
| Seebek coefficient (μV · K$^{-1}$ at 25 C. | 150 | | 250 |

Figure 7:
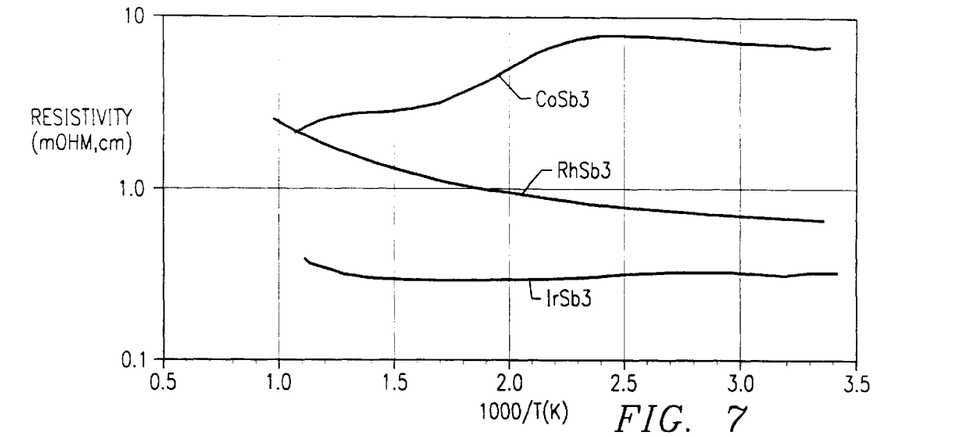
FIG. 7 is a graph showing typical electrical resistivity as an inverse function of temperature associated with semiconductor materials prepared in accordance with the present invention.
Figure 8:
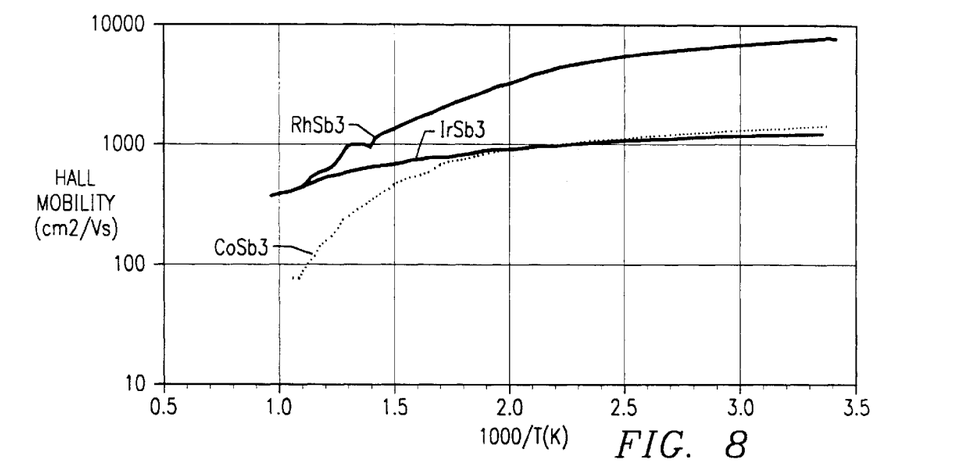
FIG. 8 is a graph showing typical Hall mobility values as an inverse function of temperature associated with semiconductor materials prepared in accordance with the present invention.
Figure 9:
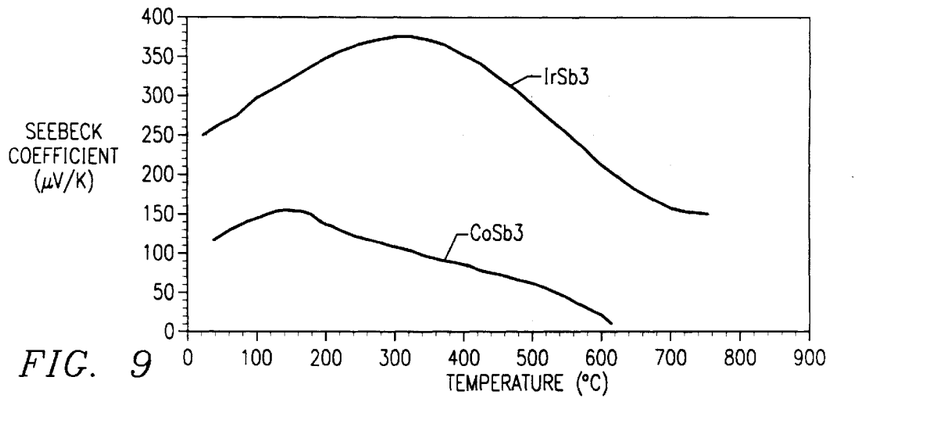
FIG. 9 is a graph showing typical Seebeck coefficients as a function of temperature for semiconductor materials prepared in accordance with the present invention.

FIG. 7 is a graphical representation of typical electrical resistivity values as a function of inverse temperature for semiconductor compounds CoSb$_3$, RhSb$_3$ and IrSb$_3$ having skutterudite-type crystal lattice structure 40. FIG. 8 is a graphical representation of typical Hall mobility functions as a measure of inverse temperatures for semiconductor compounds CoSb$_3$, RhSb$_3$ and IrSb$_3$ having skutterudite-type crystal lattice structure 40. FIG. 9 is a graphic representation of typical Seebeck coefficient values as a function of temperature for semiconductor compounds $CoSb_3$ and $IrSb_3$ having skutterudite-type crystal lattice structure 40.

Figure 10:
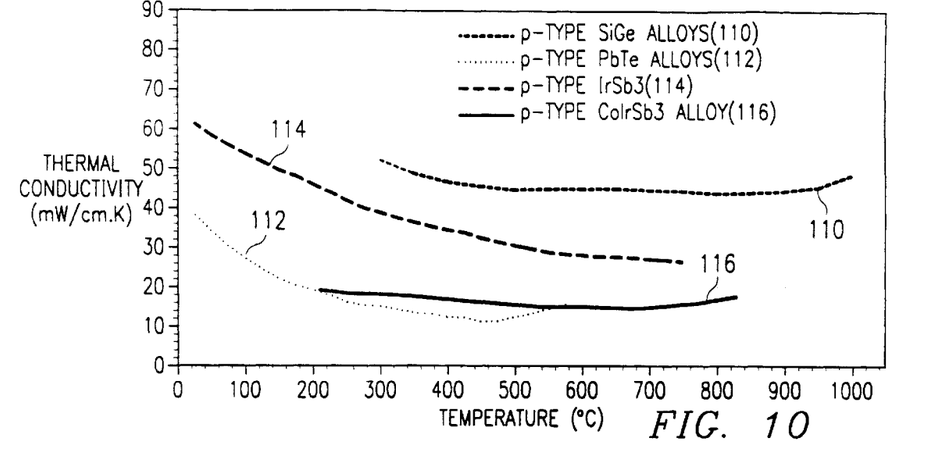
FIG. 10 is a graph showing thermal conductivity as a function of temperature for semiconductor materials prepared in accordance with the present invention as compared with presently available thermoelectric materials.
Figure 11:
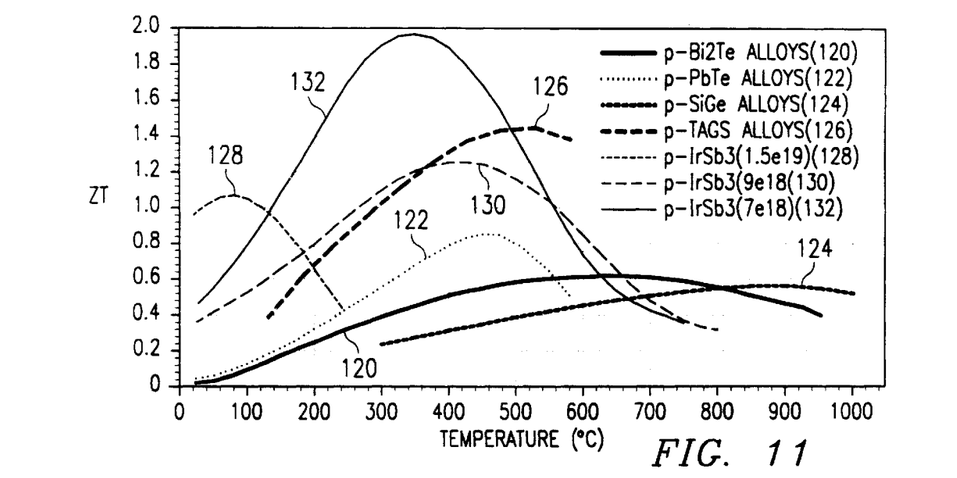
FIG. 11 is a graph showing the ZT as a function of temperature for P-type semiconductor materials prepared in accordance with the present invention having different doping levels as compared with the ZT of presently available P-type thermoelectric materials.

FIG. 10 comparisons of thermal conductivity as a function of temperature for semiconductor materials $IrSb_3$ and $Ir_{0.5}Co_{0.25}Sb_3$ prepared in accordance with the present invention as compared with previously available thermoelectric materials SiGe alloys and PbTe alloys. Curves 110 and 112 show thermal conductivity measured for semiconductor materials SiGe and PbTe respectively. Curves 114 and 116 are based on thermal conductivity measurements for semiconductor materials $IrSb_3$ and $Ir_{0.75}Co_{0.25}Sb_3$ respectively. FIG. 11 is a graph showing various values of thermoelectric ZT as a function of temperature for various samples of semiconductor material $IrSb_3$ with different doping levels. FIG. 11 also contains a graphical representation of ZT for previously available P-type thermoelectric materials. As previously noted, platinum has been found to be a satisfactory doping impurity for use with semiconductor materials having a skutterudite lattice structure 40.

A multiple stage thermoelectric cooler (not shown) is typically fabricated by vertically stacking two or more single stage thermoelectric devices 20. Each ascending thermoelectric device will have fewer thermoelectric elements or thermocouples 22. A multiple stage thermoelectric cooler is therefore typically pyramid shaped because the lower stage requires more thermoelectric elements to transfer the heat dissipated from the upper stage in addition to the heat pumped from the object being cooled by the multiple stage thermoelectric cooler. Field effect transistors are often cooled from 300° C. to 125° C. by using such multiple stage thermoelectric coolers.

Figure 12:
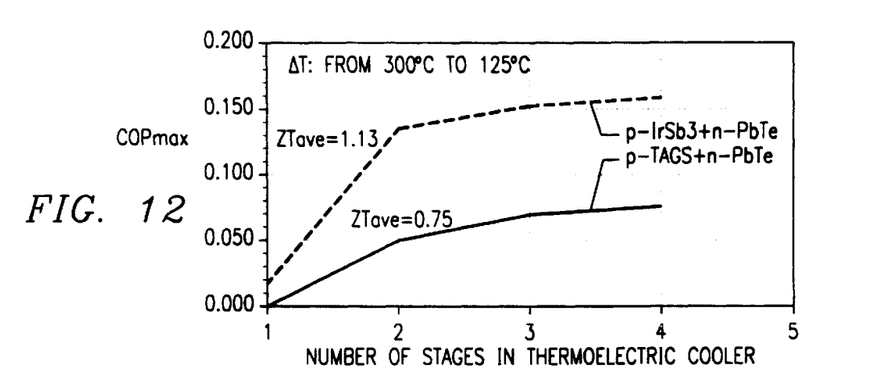
FIG. 12 is a graph showing the performance of a multiple stage thermoelectric cooler fabricated in part from semiconductor materials incorporating the present invention as compared to a multiple stage thermoelectric cooler fabricated from presently available semiconductor materials.

P-type semiconductor material $IrSb_3$ prepared in accordance with the present invention may be used to provide a portion of thermoelectric elements 22. Currently available N-type semiconductor materials $Bi_2Te_3$ may be used to provide another portion of thermoelectric elements 22. The resulting combination substantially enhances the performance of thermoelectric device 20. This combination of P-type and N-type semiconductor materials is particularly useful in the 100° C. to 400° C. temperature range. FIG. 12 is a graphical representation showing the increase in multiple stage thermoelectric cooler performance resulting from the use of P-type semiconductor materials $IrSb_3$. FIG. 12 shows the coefficient of performance ($COP_{MAX}$) as a function of the number of stages in each thermoelectric cooler.

Although the present invention has been described in detail, it should be understood that various changes, substitutions and alterations can be made herein without departing from the spirit and the scope of the invention as defined in the following claims.

What is claimed is:

1. An apparatus using a gradient freeze technique to prepare a semiconductor alloy for use in fabricating thermoelectric elements comprising:

a furnace defined in part by a housing having a chamber with a first heater and a second heater disposed therein;

the first heater disposed within the chamber above the second heater;

a thermal baffle disposed within the chamber between the first heater and the second heater;

a container disposed within the chamber with the container adjacent to the thermal baffle;

the container sealed with a vacuum formed therein;

a rod vertically disposed within the chamber and the container secured to one end of the rod; and a plurality of elemental materials selected from the group comprising Co, Rh, Ir and Sb disposed within the container for melting within the furnace to form the semiconductor alloy.

2. The apparatus as defined in claim 1 wherein the container further comprises a sealed quartz ampoule having a pointed end for attachment to the rod.

3. The apparatus as defined in claim 1 wherein the container farther comprises:

a sealed vessel with a first elemental material and a second elemental material; and the first elemental material selected from the group consisting of iridium, rhodium and cobalt, and the second elemental material comprising antimony.

4. The apparatus as defined in claim 3, further comprising an atomic ratio of antimony as compared to the first elemental material greater than 8 to 1.

5. The apparatus as defined in claim 1 further comprising the first heater, the second heater, and the thermal baffle cooperating to form a sharp temperature gradient within the container to form a single crystal of semiconductor alloy selected from the group consisting of $CoSb_3$, $RhSb_3$ and $Co_{1-x-y}Rh_xIr_ySb_3$ wherein $0 \leq x \leq 1$ and $0 \leq y \leq 1$.

6. The apparatus of claim 1 wherein the elemental materials comprise an antimony rich melt.

7. An apparatus using a liquid-solid phase sintering technique to prepare a semiconductor alloy for use in fabricating thermoelectric elements comprising:

an isothermal furnace defined in part by a housing having a chamber with a heater disposed therein;

a container disposed within the chamber, with the container spaced intermediate from the interior surfaces of the chamber; and a stoichiometric mixture of elemental materials selected from the group consisting of Co, Rh, Ir and Sb disposed within the container for melting within the furnace to form the desired semiconductor alloy.

8. The apparatus as defined in claim 7 wherein the container further comprises a sealed quartz ampoule having a pointed end for attachment to the rod.

9. The apparatus as defined in claim 7 further comprising:

a layer of iridium powder disposed within the lower portion of the container adjacent to the rod; and a layer of antimony disposed within the container above the iridium powder.

10. The apparatus as defined in claim 7 wherein the container further comprises:

a sealed vessel with a first elemental material layer and a second elemental material layer;

the first elemental material layer disposed within the lower portion of the sealed vessel, and the second elemental material layer disposed above the first material layer; and the first elemental material layer selected from the group consisting of iridium, rhodium and cobalt, and the second elemental material layer comprising antimony.

11. The apparatus as defined in claim 10, further comprising an atomic ratio of antimony in the second material layer as compared to material in the first layer greater than 8 to 1.

12. The apparatus as defined in claim 10 wherein the first material comprises a mixture of:

$$Co_{1-x-y}Rh_xIr_y$$

wherein $0 \leq x \leq 1$ and $0 \leq y \leq 1$.

* * * * *